(12) United States Patent
Xu et al.

(10) Patent No.: US 11,811,176 B2
(45) Date of Patent: Nov. 7, 2023

(54) ELECTRICAL CONNECTOR AND CIRCUIT BOARD USED IN THE CONNECTOR

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Yong-Chun Xu, Kunshan (CN); Hung-Chi Yu, New Taipei (TW); Chih-Ching Hsu, New Taipei (TW); Xiao-Qin Zheng, Kunshan (CN); Chin-Jung Wu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 12 days.

(21) Appl. No.: 17/510,674

(22) Filed: Oct. 26, 2021

(65) Prior Publication Data
US 2022/0131324 A1 Apr. 28, 2022

(30) Foreign Application Priority Data
Oct. 26, 2020 (CN) .......................... 202011154000.9

(51) Int. Cl.
*H01R 24/64* (2011.01)
*H01R 13/6476* (2011.01)

(52) U.S. Cl.
CPC ......... *H01R 24/64* (2013.01); *H01R 13/6476* (2013.01)

(58) Field of Classification Search
CPC ............................. H01R 24/64; H01R 13/6476
See application file for complete search history.

(56) References Cited

U.S. PATENT DOCUMENTS

| 7,641,521 B2 | 1/2010 | Pepe et al. |
| 7,736,195 B1 * | 6/2010 | Poulsen ............. H01R 13/6658 439/676 |

(Continued)

FOREIGN PATENT DOCUMENTS

CN 204243400 4/2015

*Primary Examiner* — Alexander Gilman
(74) *Attorney, Agent, or Firm* — Ming Chieh Chang

(57) ABSTRACT

An electrical connector includes a terminal module having a circuit board having first through eighth conductive traces sequentially arranged in a transverse direction and corresponding first through eighth terminals, the third terminal and the sixth terminal being configured for transmitting a pair of differential signals, the fourth terminal and the fifth terminal being configured for transmitting another pair of differential signals, the first through eighth conductive traces being respectively electrically connected to corresponding first through eighth terminals, each of the third conductive trace and the fifth conductive trace including a coupling portion, a size of the coupling portion in the transverse direction is larger than a size of the other part of the corresponding conductive trace in the transverse direction, wherein the coupling portion of the third conductive trace and the coupling portion of the fifth conductive trace overlap in an up and down direction to increase mutual coupling.

5 Claims, 15 Drawing Sheets

(56) References Cited

U.S. PATENT DOCUMENTS

| | | | | |
|---|---|---|---|---|
| 7,850,492 B1* | 12/2010 | Straka | ............... | H05K 1/0228 |
| | | | | 439/676 |
| 8,246,389 B2* | 8/2012 | Zhang | ............... | H01R 13/6466 |
| | | | | 439/76.1 |
| 8,287,317 B2* | 10/2012 | Straka | ............... | H05K 1/0228 |
| | | | | 439/676 |
| 8,500,496 B2* | 8/2013 | Bopp | ............... | H01R 24/00 |
| | | | | 439/676 |
| 8,568,177 B2* | 10/2013 | Bopp | ............... | H01R 13/6469 |
| | | | | 439/676 |
| 8,936,494 B2* | 1/2015 | Weinmann | ............... | H01R 24/64 |
| | | | | 439/620.17 |
| 9,136,632 B2* | 9/2015 | Yu | ............... | H01R 13/405 |
| 9,219,326 B2* | 12/2015 | Zhang | ............... | H01R 24/64 |
| 10,014,634 B2* | 7/2018 | Lin | ............... | H01R 24/64 |
| 2002/0057137 A1* | 5/2002 | Marketkar | ............... | H01P 5/185 |
| | | | | 333/24 R |
| 2002/0177368 A1* | 11/2002 | Hyland | ............... | H01R 24/64 |
| | | | | 439/676 |
| 2010/0048040 A1* | 2/2010 | Straka | ............... | H01R 13/6469 |
| | | | | 439/55 |
| 2010/0197162 A1* | 8/2010 | Straka | ............... | H01R 13/518 |
| | | | | 439/404 |
| 2011/0300758 A1* | 12/2011 | Zhang | ............... | H01R 13/6466 |
| | | | | 439/626 |
| 2014/0273639 A1* | 9/2014 | Larsen | ............... | H01R 13/6658 |
| | | | | 439/620.23 |
| 2014/0342610 A1* | 11/2014 | Hashim | ............... | H01R 13/6466 |
| | | | | 439/620.22 |
| 2016/0036166 A1* | 2/2016 | Hashim | ............... | H01R 13/6473 |
| | | | | 439/676 |
| 2022/0131324 A1* | 4/2022 | Xu | ............... | H01R 13/6476 |

\* cited by examiner

ELECTRICAL CONNECTOR AND CIRCUIT BOARD USED IN THE CONNECTOR

BACKGROUND OF THE INVENTION

1. Field of the Invention

The present invention relates generally to an electrical connector and a circuit board used in the electrical connector that can reduce crosstalk interference between signal transmission paths.

2. Description of Related Arts

With the increase of data transmission speed, how to reduce or eliminate the crosstalk interference in the electrical connector becomes very important. A conventional electrical connector has a total of 8 terminals forming four channels—a third terminal and a sixth terminal forming a second channel to transmit a pair of differential signals and a fourth terminal and a fifth terminal forming a third channel to transmit a pair of differential signals. The fourth terminal and the fifth terminal are sandwiched between the third terminal and the sixth terminal, causing the four terminals in the second channel and the third channel to have the largest cross talk interference among the eight terminals. The three common traditional methods to reduce crosstalk interference are: increasing the distance between the terminals to reduce the mutual capacitance or mutual inductance between the terminals; adopting shield and isolation measures between the terminals; and adding capacitance or inductance by compensation measures between terminals. However, because the frame interface structure and terminal definition have been fixed, it is difficult to reduce the crosstalk interference by increasing the distance between the terminals or not cost effective for increasing metal sheets and adding capacitance or inductance between terminals.

U.S. Pat. No. 7,641,521 discloses an electrical connector comprising a housing, a plurality of contacts within the housing, and a compensation component housed within the housing. The compensation component has a substrate with a first trace plane and a second trace plane. The compensation component has a plurality of traces arranged on the first trace plane, the traces being electrically connected to selected ones of the contacts, wherein at least one of the traces includes a compensation loop arranged at least in part on the first trace plane, and at least one of the traces includes a compensation loop arranged at least in part on the second trace plane. For example, each trace may include a primary trace that extends between a first end and a second end. Additionally, at least some of the traces may include at least one compensation loop that defines a secondary trace connected to the primary trace at at least two tap points. Some of the traces may not include any compensation loops.

An improved electrical connector and a circuit board used in the electrical connector is desired.

SUMMARY OF THE INVENTION

A main object of the present invention is to provide an electrical connector and a circuit board used in the connector that can effectively reduce the crosstalk interference between signal transmission paths and has a simple structure.

To achieve the above-mentioned object, an electrical connector comprises an insulating body and a terminal module housed in the insulating body, the terminal module including: a circuit board having first through eighth conductive traces sequentially arranged in a transverse direction; and first through eighth terminals arranged in sequence along the transverse direction and electrically connected to the circuit board, the third terminal and the sixth terminal being configured for transmitting a pair of differential signals, the fourth terminal and the fifth terminal being configured for transmitting another pair of differential signals, the first through eighth conductive traces being respectively electrically connected to corresponding first through eighth terminals, each of the third conductive trace and the fifth conductive trace including a coupling portion, a size of the coupling portion in the transverse direction is larger than a size of the other part of the corresponding conductive trace in the transverse direction, wherein the coupling portion of the third conductive trace and the coupling portion of the fifth conductive trace overlap in an up and down direction to increase mutual coupling.

To achieve the above-mentioned object, a circuit board used in an electrical connector includes first through eighth conductive traces sequentially arranged in a transverse direction, the third conductive trace and the sixth conductive trace designed for transmitting a pair of differential signals, the fourth conductive trace and the fifth conductive trace designed for transmitting another pair of differential signals, each of the third conductive trace and the fifth conductive trace including a coupling portion, a size of the coupling portion in the transverse direction is larger than a size of the other part of the corresponding conductive trace in the transverse direction, wherein the coupling portion of the third conductive trace and the coupling portion of the fifth conductive trace are facing each other in an up-and-down direction to cancel crosstalk interference.

Compared to the prior art, in the electrical connector of the present invention, the coupling portion of the third conductive trace and the coupling portion of the fifth conductive trace overlap in the up and down direction, to increase the capacitive coupling benefit of the third conductive trace and the fifth conductive trace, thereby reducing the crosstalk interference between the conductive traces.

DETAILED DESCRIPTION OF THE PREFERRED EMBODIMENT

Figure 1:
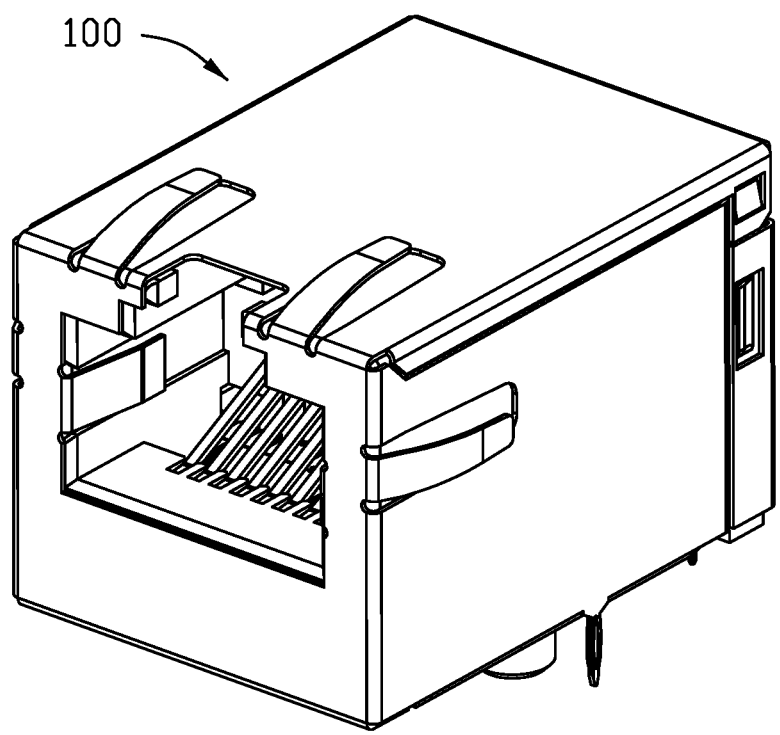
FIG. 1 is a perspective view of an electrical connector in accordance with the present invention.
Figure 2:
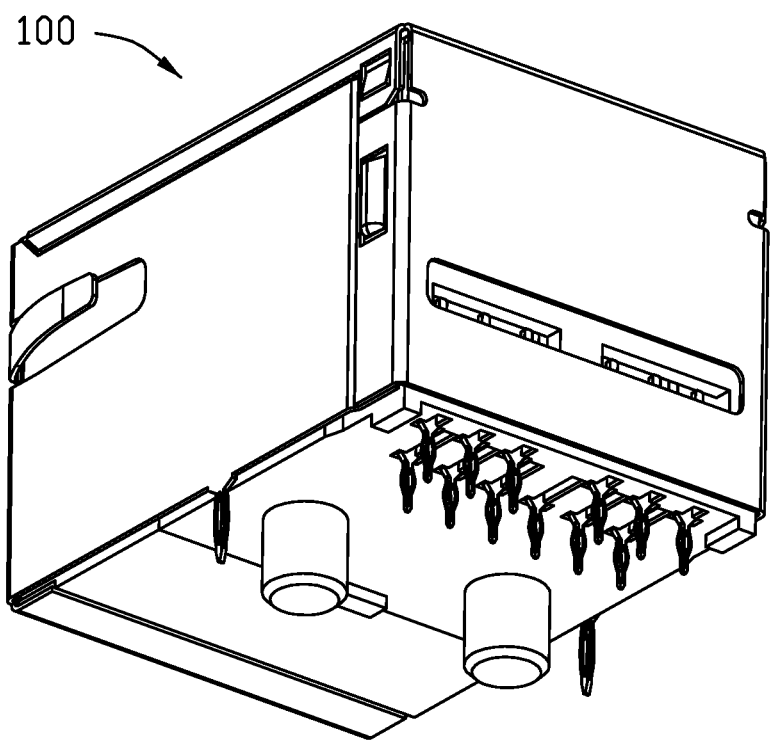
FIG. 2 is another perspective view of the electrical connector in FIG. 1.
Figure 3:
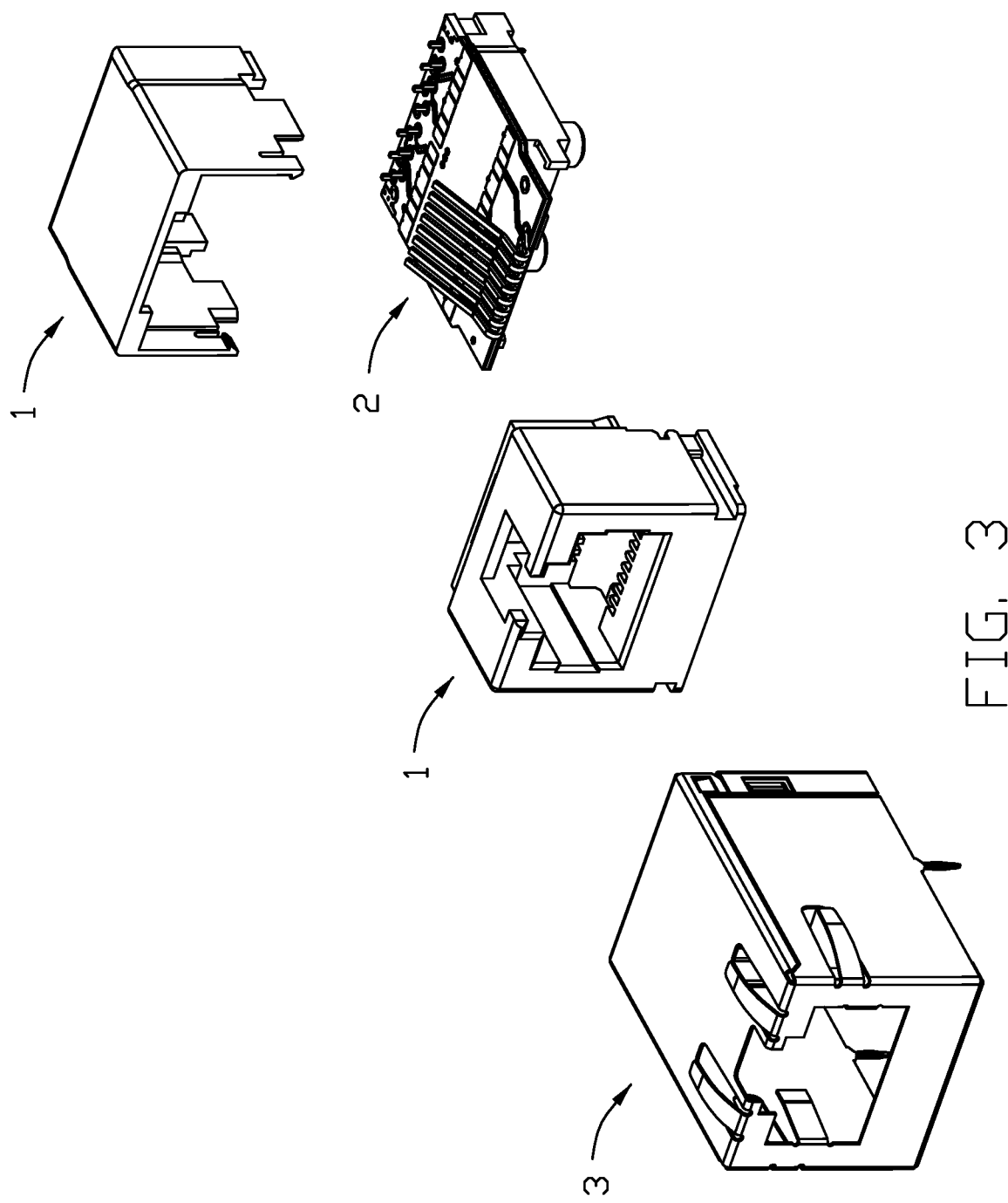
FIG. 3 is an exploded view of the electrical connector in FIG. 2.
Figure 4:
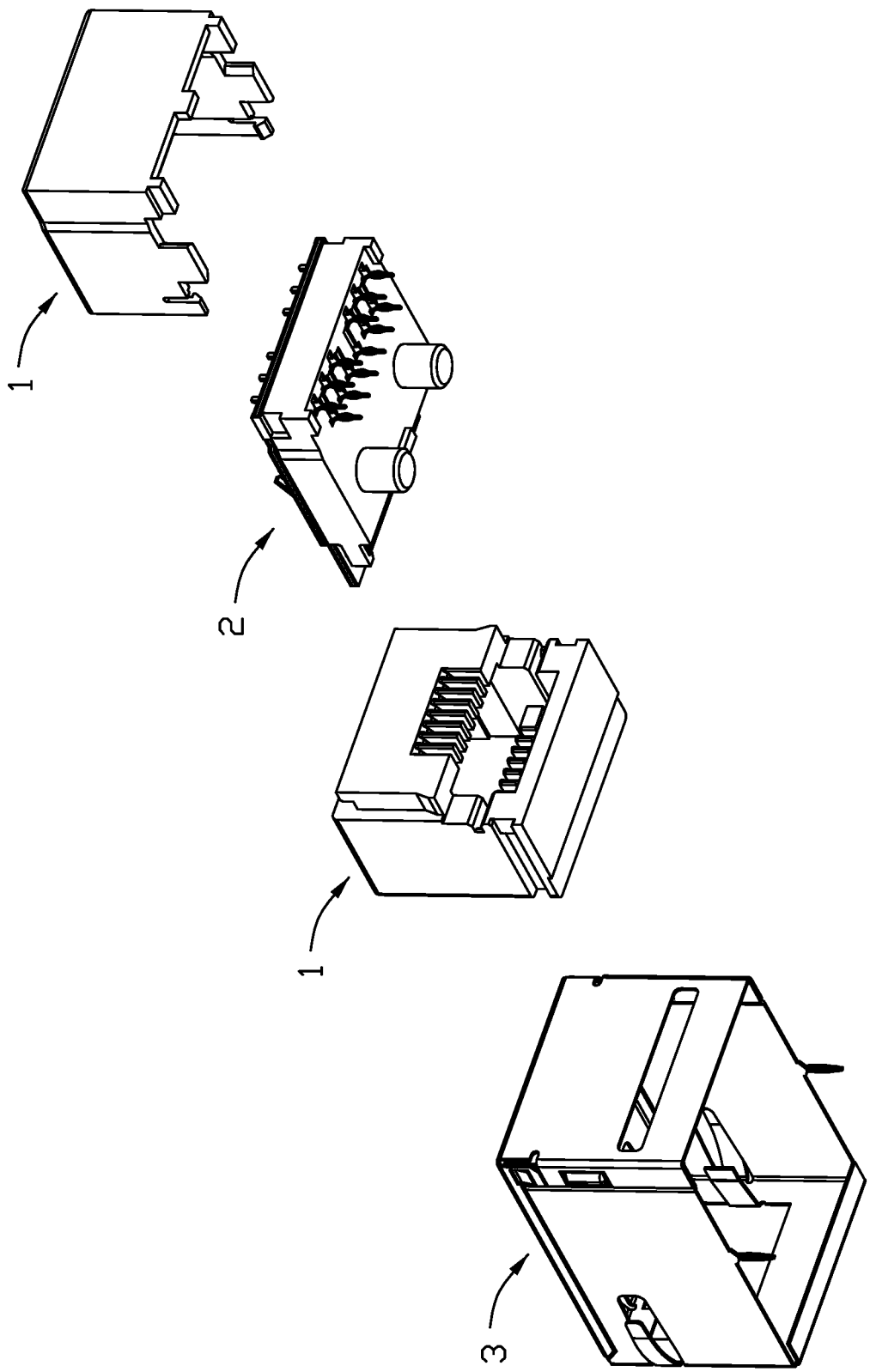
FIG. 4 is another exploded view of the electrical connector in FIG. 3.
Figure 5:
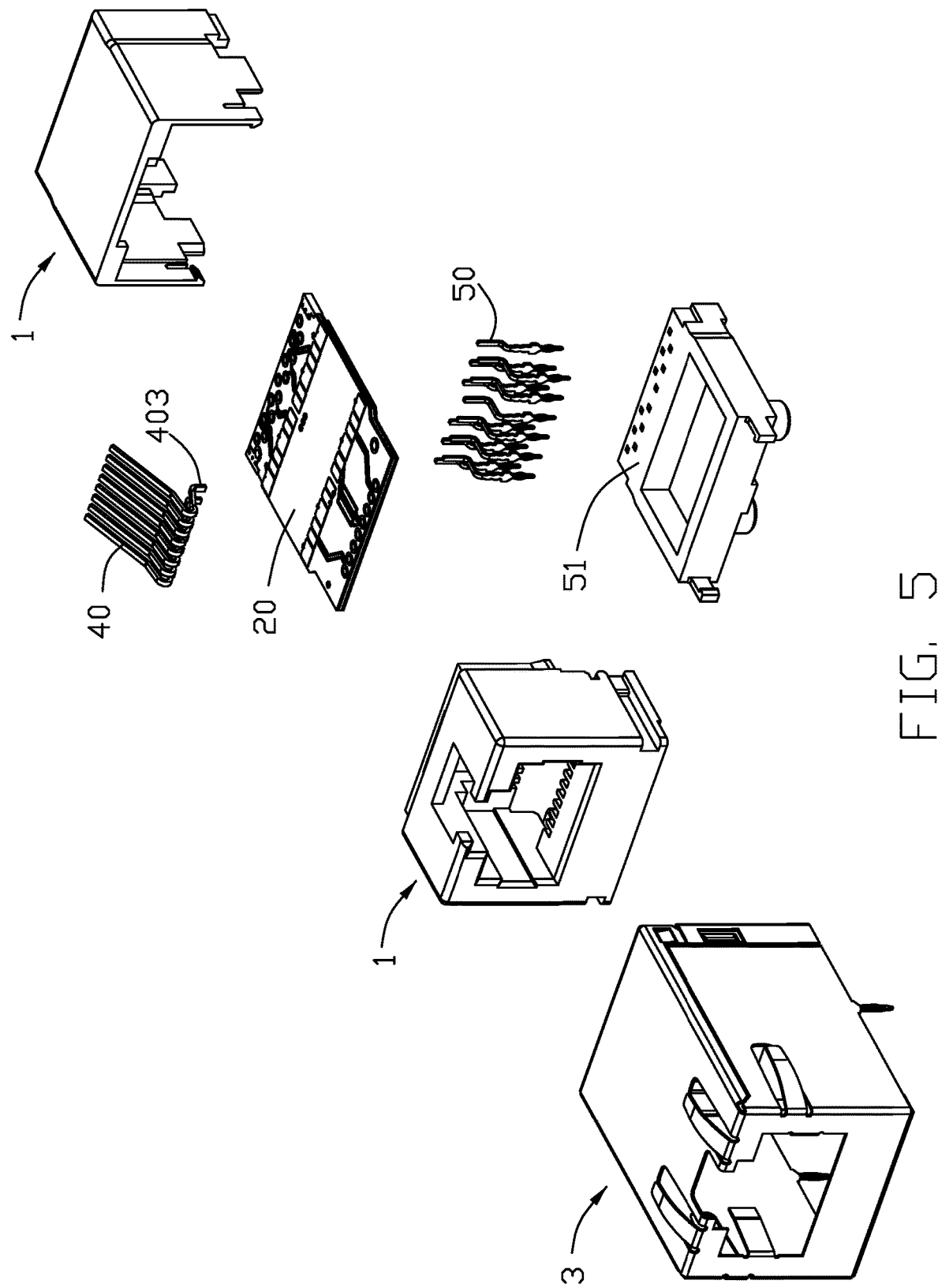
FIG. 5 is further exploded view of the electrical connector in FIG. 4.
Figure 6:
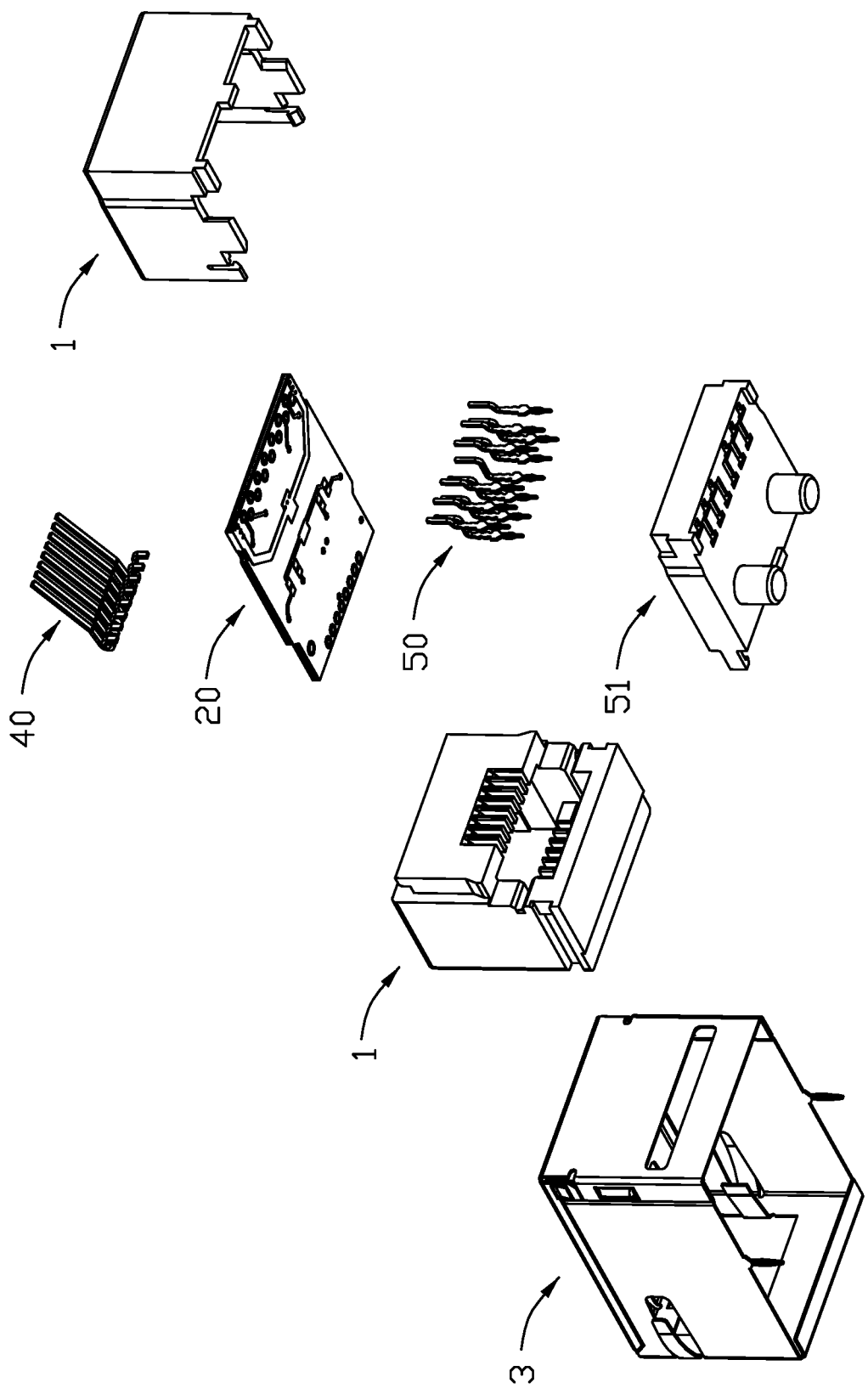
FIG. 6 is another perspective view of the electrical connector in FIG. 5.
Figure 7:
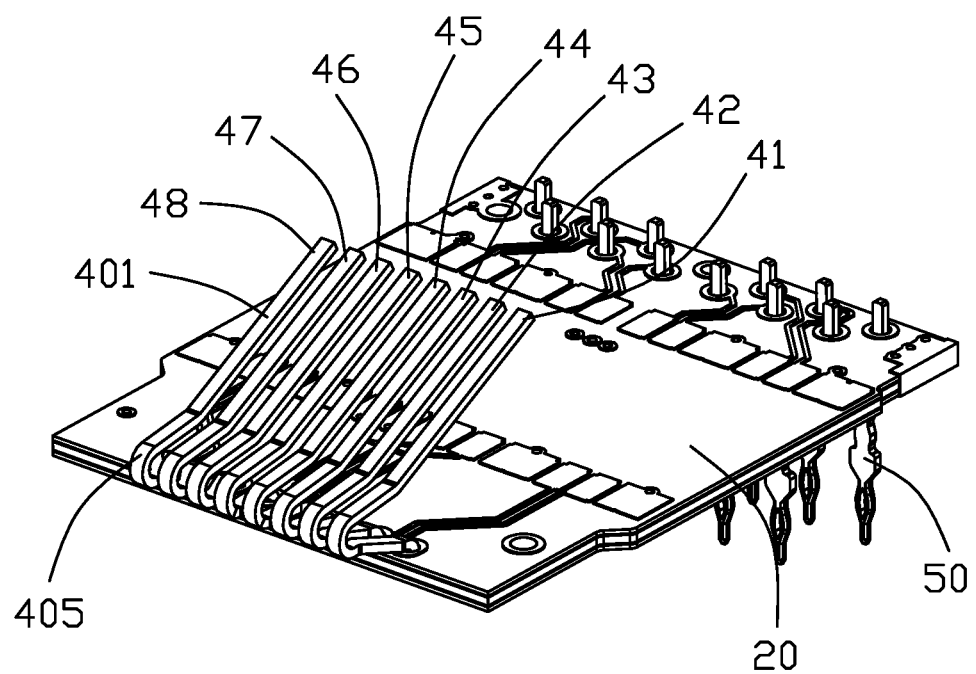
FIG. 7 is a perspective view of the partial composition of the terminal module of the electrical connector in FIG. 3.
Figure 8:
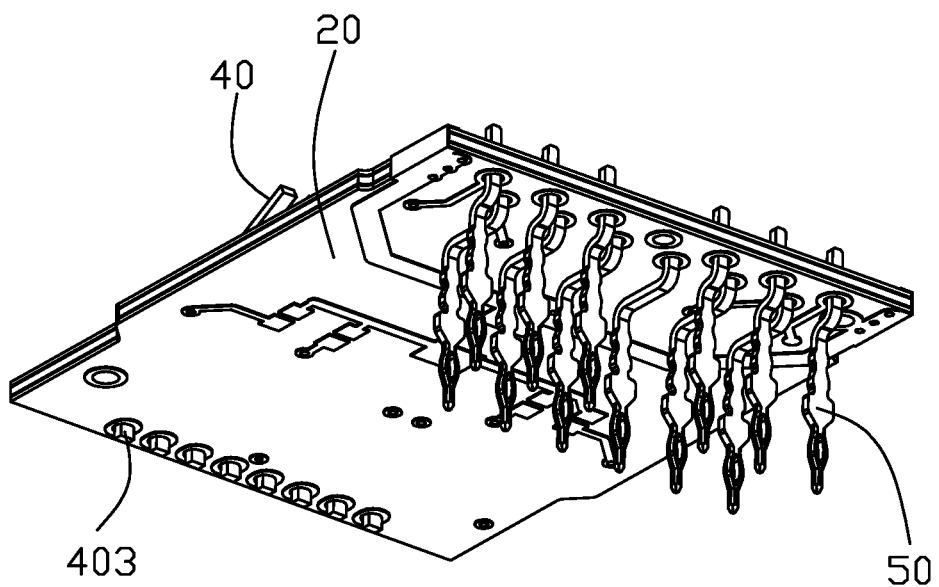
FIG. 8 is another perspective view of the partial composition of the terminal module of the electrical connector in FIG. 7.
Figure 9:
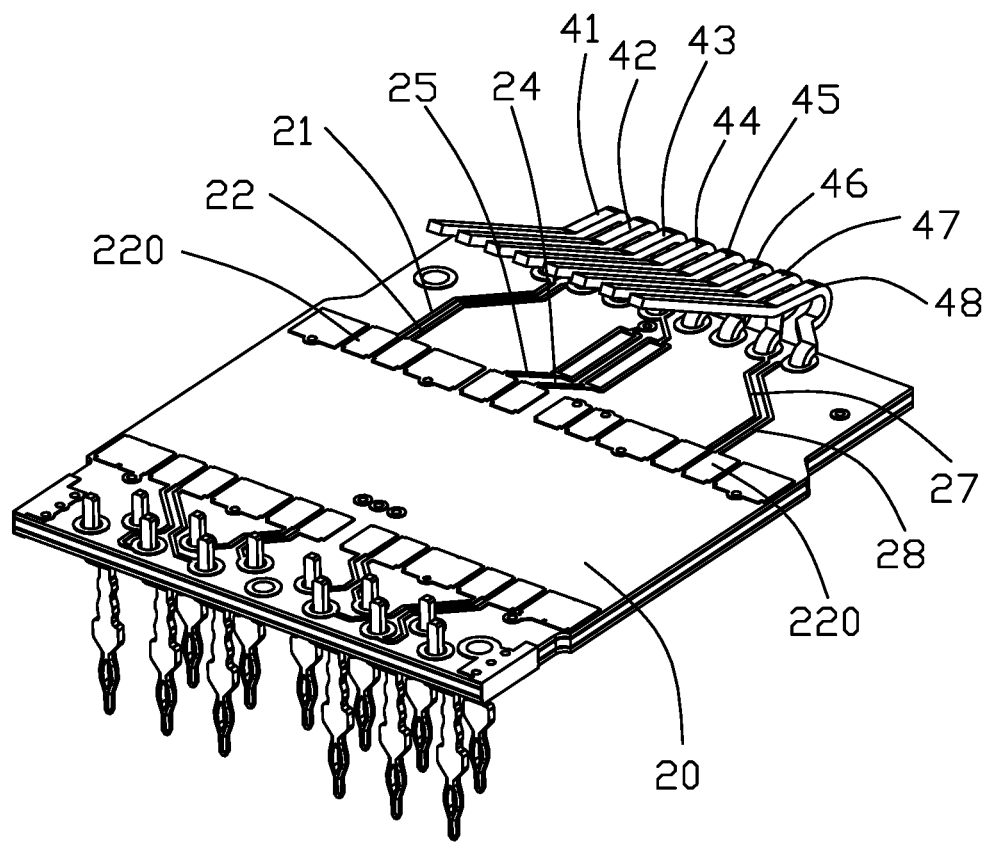
FIG. 9 is another perspective view of the partial composition of the terminal module of the electrical connector in FIG. 7.
Figure 10:
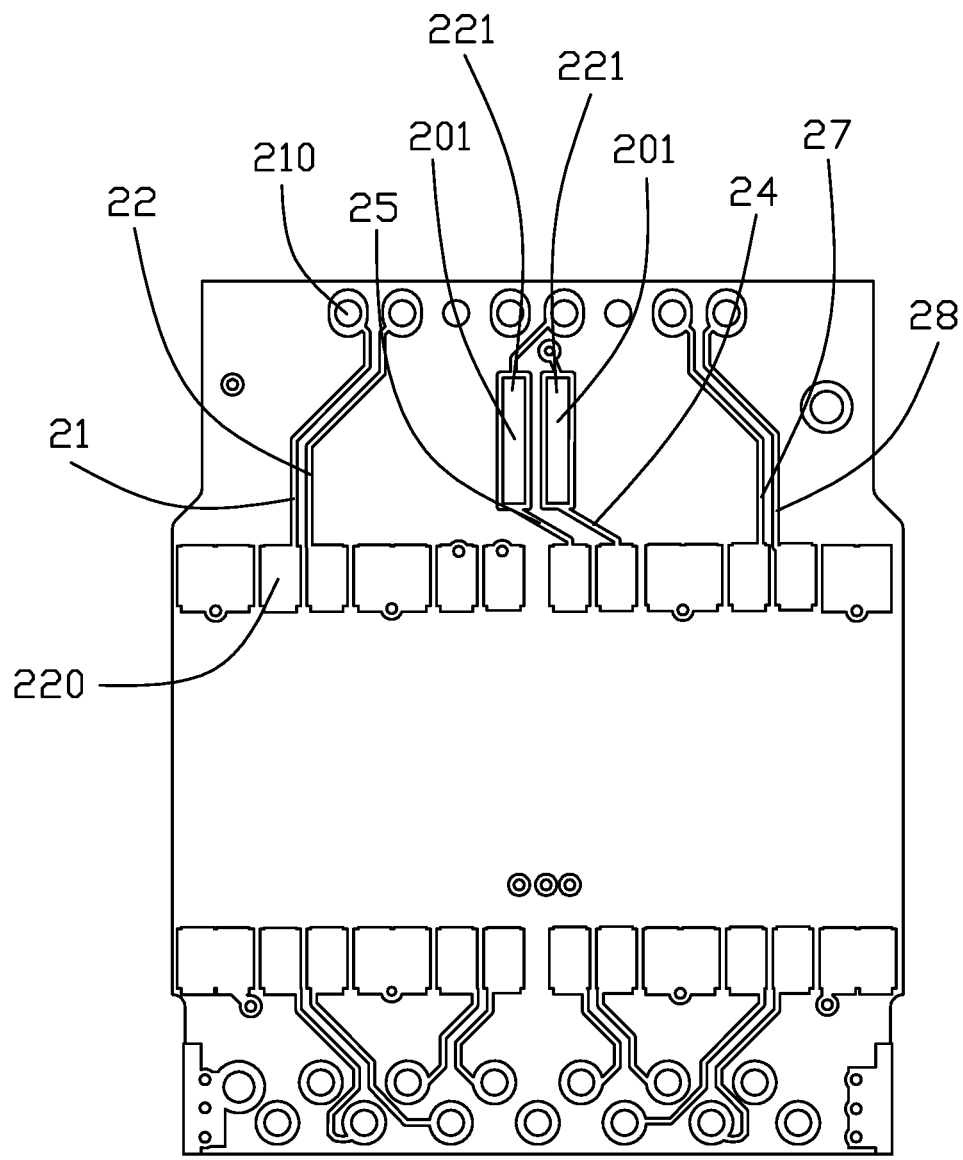
FIG. 10 is the front view of one layer of the circuit board of the terminal module in FIG. 7.
Figure 11:
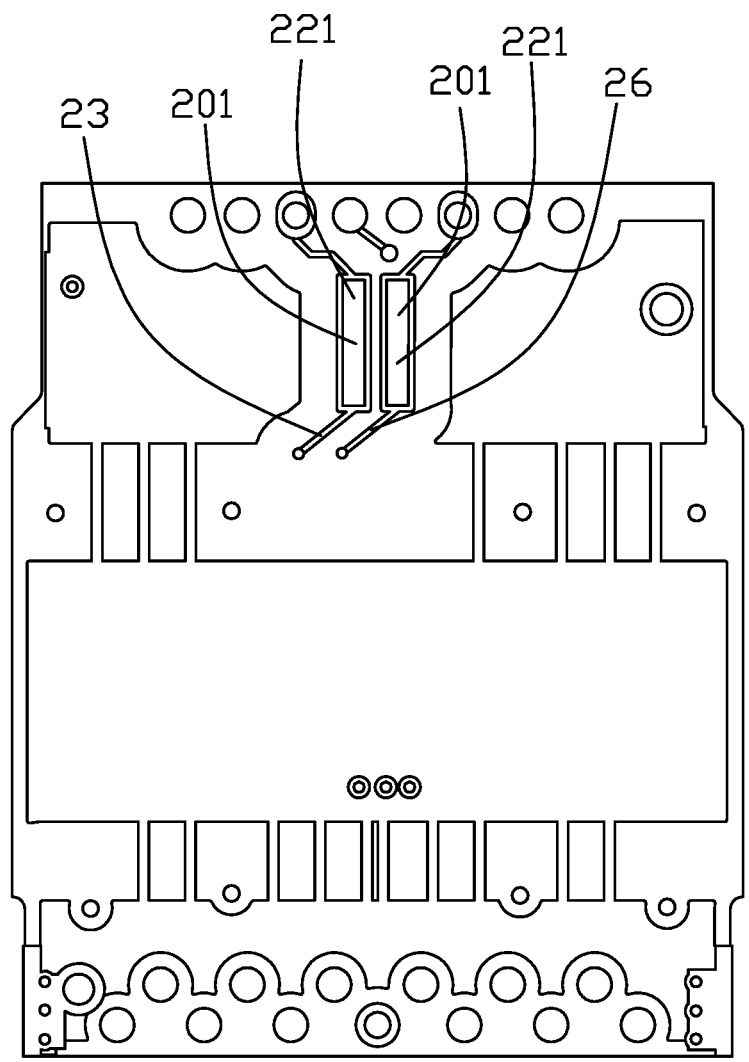
FIG. 11 is the front view of another layer of the circuit board in FIG. 10.
Figure 12:
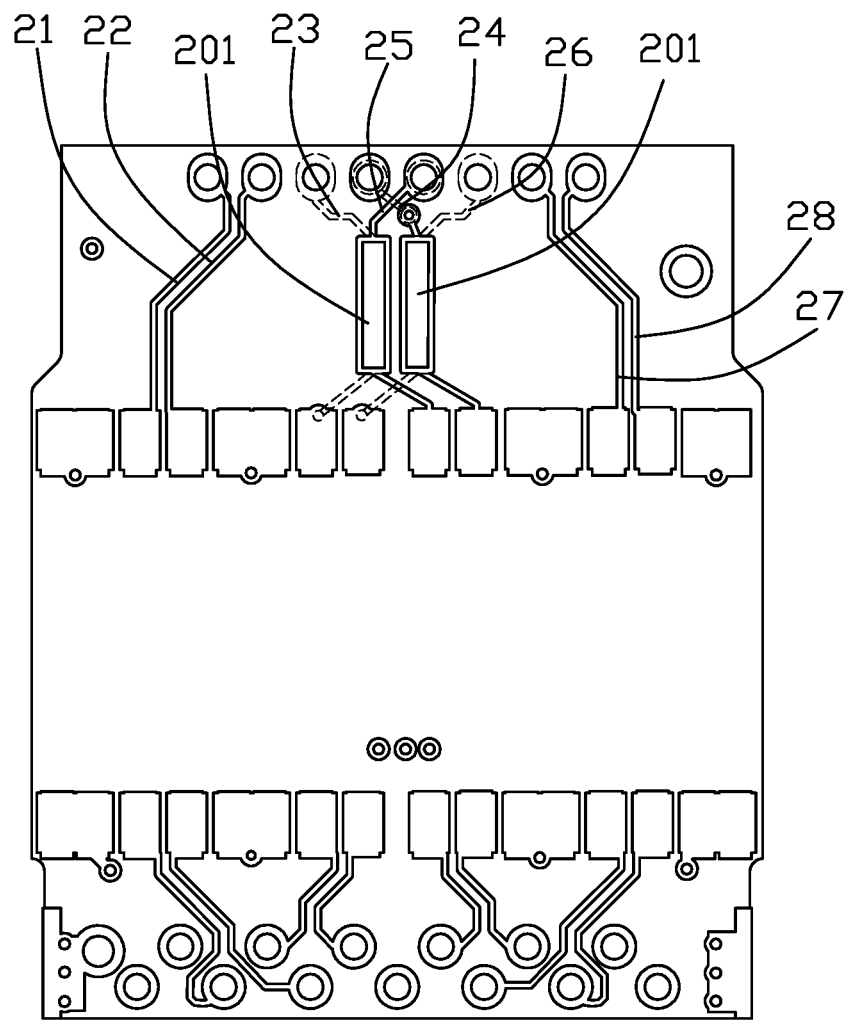
FIG. 12 is the front projection of another layer of the circuit board shown in FIG. 11 to the one layer shown in FIG. 10.

Referring to FIGS. 1-15, an electrical connector 100 in accordance with the present invention is shown. It can be matched with a mating connector (not shown). The electrical connector 100 has a first, a second, a third, and a fourth differential signal transmission channel. The electrical connector 100 includes an insulating body 1, a terminal module 2 housed in the insulating body 1, and a metal shielding shell 3 surrounding the insulating body. The terminal module 2 includes a circuit board 20, a plurality of terminals 40 mounted and electrically connected to the circuit board 20, a plurality of pin terminals 50 mounted on the circuit board 20, a fixing block 51 for fixing the pin terminals 50, and a filter component (not shown) between the electrical connection and the terminal 40 and the pin terminal 50. The filter components are respectively connected to the first, second, third, and fourth differential signal transmission channels.

The plurality of terminals 40 include a first terminal 41 to an eighth terminal 48 arranged in sequence in the transverse direction. For ease of understanding, in this embodiment, the transverse direction is the left and right direction, the mating direction with the mating connector (not shown) is the front-rear direction, and the direction perpendicular to the front-rear direction and the transverse direction is the up and down direction. The eight terminals 40 have the same shape. Each of the terminals 40 includes a mating portion 401 that extends backward and upward and is used for conductive mating with a mating connector, a mounting portion 403 that can be mounted on the circuit board 20, and a connecting portion 405 that connects the mating portion 401 and the mounting portion 403. The first terminal 41 and the second terminal 42 constitute a first differential terminal pair, the third terminal 43 and the sixth terminal 46 constitute a second differential terminal pair, the fourth terminal 44 and the fifth terminal 45 constitute a third differential terminal pair, and the seventh terminal 47 and the eighth terminal 48 constitute a fourth differential terminal pair. In this way, the third differential terminal pair is located between the second differential terminal pair in the transverse direction.

The circuit board 20 includes a plurality of mounting holes 210 arranged in the transverse direction for mounting the corresponding mounting portions 403 of the first terminal 41 to the eighth terminal 48, a plurality of soldering pad 220 arranged in the transverse direction and electrically connected to the filter assembly, and first conductive trace 21 to the eighth conductive trace 28 between the mounting hole 210 and the soldering pad 220. One ends of the first conductive trace 21 to the eighth conductive trace 28 are respectively electrically connected to the corresponding first terminal 41 to the eighth terminal 48, the other ends of the first conductive trace 21 to the eighth conductive trace 28 are respectively electrically connected to the corresponding soldering pad 220.

The circuit board 20 includes plurality of layers. The first conductive trace 21, the second conductive trace 22, the fourth conductive trace 24, the fifth conductive trace 25, the seventh conductive trace 27, and the eighth conductive trace 28 are arranged in one layer. The third conductive trace 23 and the sixth conductive trace 26 are arranged in another layer different from the one layer. The first conductive trace 21 and the second conductive trace 22 are offset in a direction away from other conductive traces in the transverse direction. The seventh conductive trace 27 and the eighth conductive trace 28 are offset in a direction away from other conductive traces in the transverse direction.

The third conductive trace 23 and the fifth conductive trace 25 are close to each other in the transverse direction to increase the coupling of the third conductive trace 23 and the fifth conductive trace 25. The sixth conductive trace 26 and the fourth conductive trace 24 are close to each other in the transverse direction to increase the coupling of the sixth conductive trace 26 and the fourth conductive trace 24. Each of the third conductive trace 23 to the sixth conductive trace 26 includes a coupling portion 201. The transverse dimension of the coupling portion 201 is larger than the transverse dimension of the other parts of the conductive trace. The coupling portion 201 of the third conductive trace 23 and the coupling portion 201 of the fifth conductive trace 25 are close to each other in the transverse direction. The coupling portion 201 of the fourth conductive trace 24 and the coupling portion 206 of the sixth conductive trace 26 are close to each other in the transverse direction. Furthermore, the coupling portion 201 of the third conductive trace 23 and the coupling portion 201 of the fifth conductive trace 25 overlap in the up and down direction to form a physical capacitance effect, thereby canceling the crosstalk interference of the sixth conductive trace 26 to the fifth conductive trace 25. The coupling portion 201 of the fourth conductive trace 24 and the coupling portion 201 of the sixth conductive trace 26 overlap in the up and down direction to form a physical capacitance effect, thereby canceling the crosstalk interference of the third conductive trace 23 to the forth conductive trace 24. The coupling portions of the third conductive trace 23 to the sixth conductive trace 26 have the same shape. The coupling portion 201 includes a hollow portion 221. The hollow portion 221 may be symmetrically arranged on the central part of the coupling portion 201, or may be only arranged on one or both sides of the coupling portion 201. Compared with a solid structure, the hollow portion 221 can reduce the loop impedance, so that the impedance on the entire loop remains matched. The shape of the coupling hollow portion 201 can be one of rectangle, oval, diamond, circle or bone shape. Preferably, the coupling hollow portion 201 in this embodiment is a hollow rectangular structure. The fourth conductive trace 24 and the fifth conductive trace 25 are interlaced with each other in the transverse direction, and the coupling portion 201 of the fourth conductive trace 24 and the coupling portion 201 of the fifth conductive trace 25 do not overlap each other. That is, the coupling portion of the fourth conductive trace is located on the right side of the coupling portion of the fifth conductive trace, the coupling portion 201 of the fifth conductive trace 25 is located on the left side of the coupling portion 201 of the fourth conductive trace 24.

Figure 13:
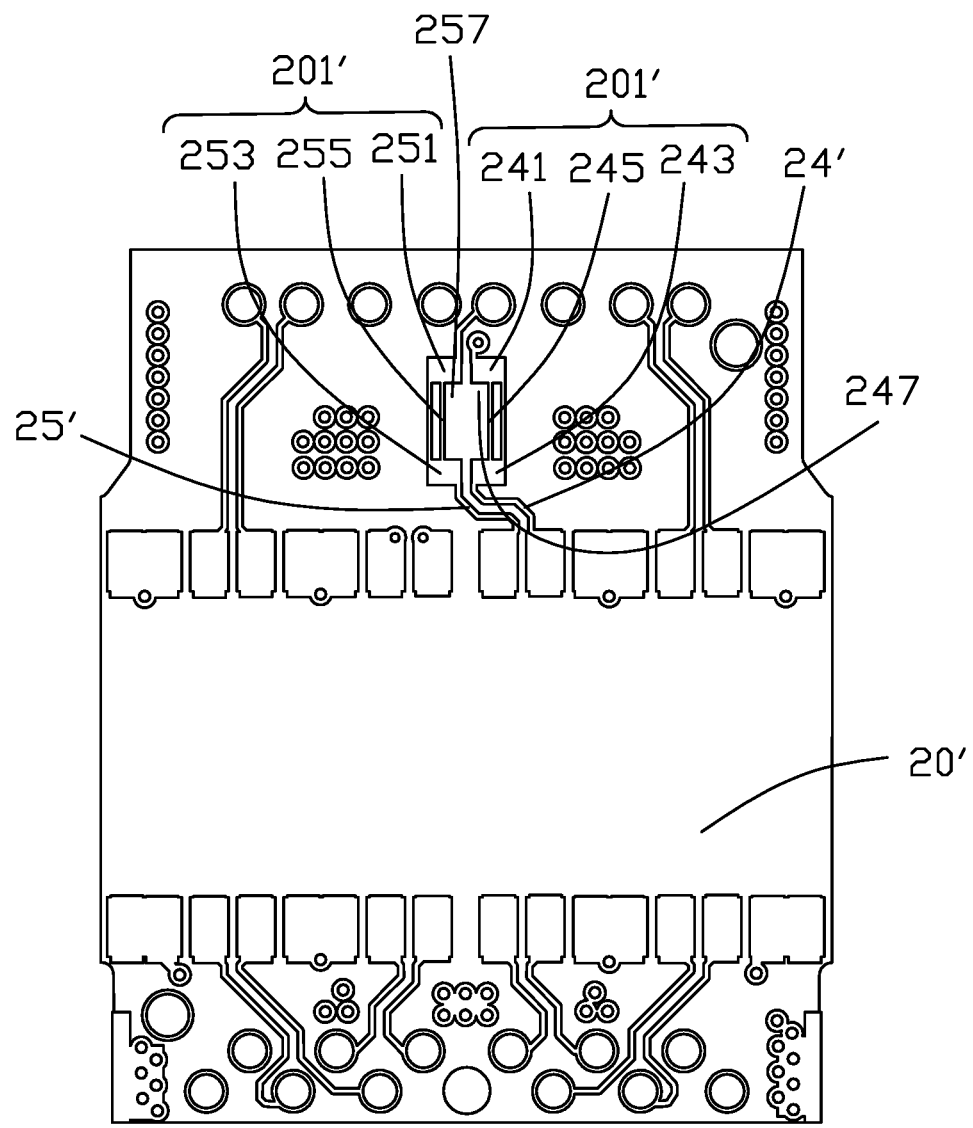
FIG. 13 is a front view of one layer of a circuit board according to another embodiment of the present invention.
Figure 14:
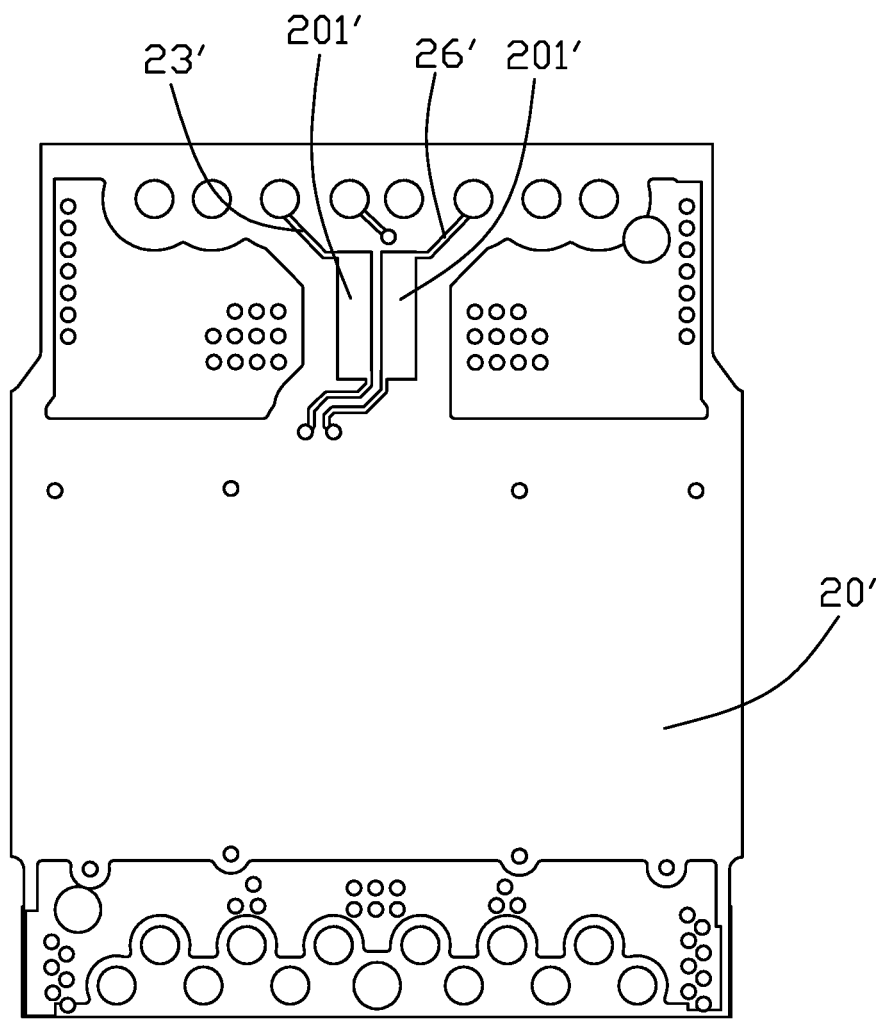
FIG. 14 is the front view of another layer of the circuit board shown FIG. 11.
Figure 15:
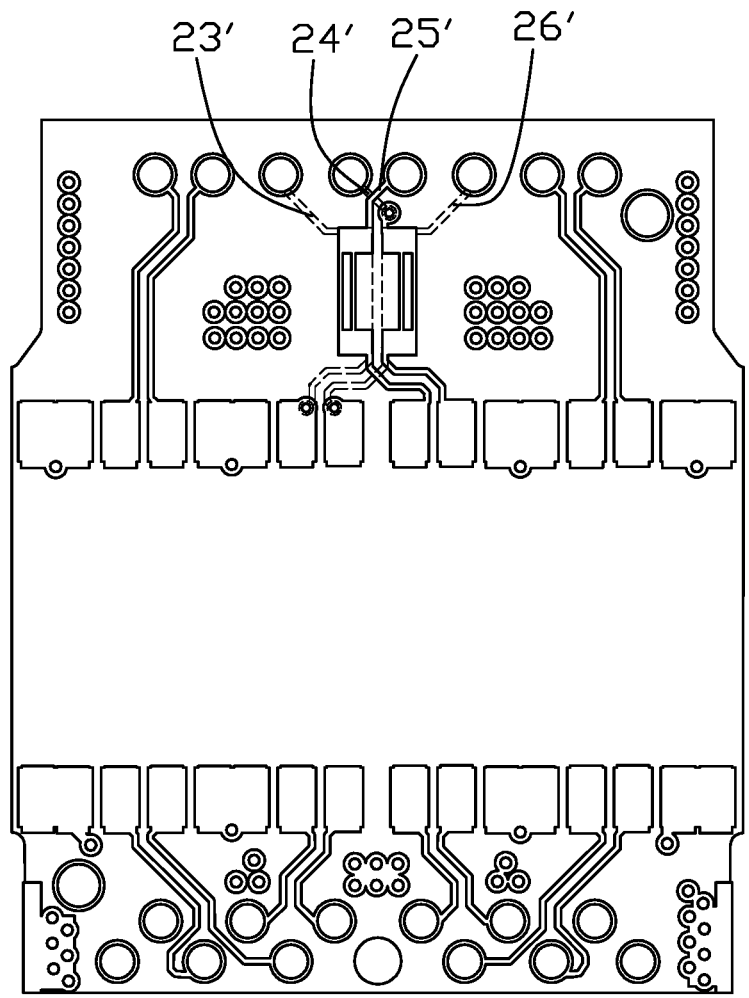
FIG. 15 is the front projection of another layer of the circuit board shown in FIG. 14 to the one layer shown in FIG. 13.

Referring to FIGS. 13-15, a circuit board 20' in accordance with another embodiment of the present invention. Compared with the first embodiment, in this embodiment, one of the coupling portion 201' of the third conductive trace 23' and the coupling portion 201' of the fifth conductive trace 25' is a solid structure, and the other is a hollow structure, one of the coupling portion 201' of the fourth conductive trace 24' and the coupling portion 201' of the sixth conductive trace 26' is a solid structure, and the other is a hollow structure. This design can not only ensure the coupling, but also will not reduce the impedance due to the increase in the area of the coupling portion. Preferably, in this embodiment, the coupling portion 201' of the third conductive trace 23' is a solid structure, and the coupling portion 201' of the fifth conductive trace 25' includes a hollow portion 255, the coupling portion 201' of the sixth conductive trace 26' is a solid structure, and the coupling portion 201' of the fourth conductive trace 24' includes a hollow portion 245. The coupling portion 201' of the fourth conductive trace 24' includes a front solid portion 241, a rear solid portion 243, and a hollow portion 245 that connects the front solid portion 241 and the rear solid portion 243 and is spaced apart in the transverse direction. The coupling portion 201' of the fifth conductive trace 25' includes a front solid portion 251, a rear solid portion 253, and a hollow portion 255 that connects the front solid portion 251 and the rear solid portion 253 and is spaced apart in the transverse direction. The left side of the coupling portion of the fourth conductive trace includes a recessed portion 247 recessed to the right. The right side of the coupling portion of the fifth conductive trace includes a recessed portion 257 recessed to the left. The hollowed portion 245 of the fourth conductive trace 24' and the hollowed portion 255 of the fifth conductive trace 25' are offset away from each other in the transverse direction. The hollow portion 245 is disposed at a position close to the right side of the fourth conductive trace 24 in the transverse direction, the hollow portion 255 is disposed at a position close to the left side of the fifth conductive trace 25' in the transverse direction.

In the present invention, based on the principle of circuit compensation and the principle of parallel plate capacitance. The third conductive trace and the fifth conductive trace are provided with coupling portions whose transverse dimensions are larger than those of other parts, and the coupling portion of the third conductive trace and the coupling portion of the fifth conductive trace overlap in the up and down direction to cancel the crosstalk interference of the sixth conductive trace to the fifth conductive trace. By increasing the relative area between the conductive paths to enhance capacitive coupling, thereby reducing crosstalk between terminals

What is claimed is:

1. An electrical connector comprising:
an insulating body; and
a terminal module housed in the insulating body, the terminal module including:
a circuit board having first through eighth conductive traces sequentially arranged in a transverse direction; and
first through eighth terminals arranged in sequence along the transverse direction and electrically connected to the circuit board, the third terminal and the sixth terminal being configured for transmitting a pair of differential signals, the fourth terminal and the fifth terminal being configured for transmitting another pair of differential signals, the first through eighth conductive traces being respectively electrically connected to corresponding first through eighth terminals, each of the third conductive trace and the fifth conductive trace including a coupling portion, a size of the coupling portion in the transverse direction is larger than a size of the other part of the corresponding conductive trace in the transverse direction; wherein
the coupling portion of the third conductive trace and the coupling portion of the fifth conductive trace overlap in an up and down direction to increase mutual coupling;
the coupling portion of the fourth conductive trace and the coupling portion of the sixth conductive trace overlap in the up and down direction to increase mutual coupling;
the circuit board includes a plurality of layers, the coupling portion of the third conductive trace and the coupling portion of the sixth conductive trace are located on one layer of the circuit board, and the coupling portion of the fourth conductive trace and the coupling portion of the fifth conductive trace are located in another layer;
the coupling portion of the third conductive trace and the coupling portion of the fifth conductive trace are close to each other in the transverse direction, the coupling portion of the fourth conductive trace and the coupling portion of the sixth conductive trace are close to each other in the transverse direction; and
each of the coupling portion includes a hollow portion to keep the impedance matching on the entire loop.

2. The electrical connector as claimed in claim 1, wherein the coupling portions of the third through the sixth conductive traces have same shape.

3. An electrical connector comprising:
an insulating body; and
a terminal module housed in the insulating body, the terminal module including:
a circuit board having first through eighth conductive traces sequentially arranged in a transverse direction; and
first through eighth terminals arranged in sequence along the transverse direction and electrically connected to the circuit board, the third terminal and the sixth terminal being configured for transmitting a pair of differential signals, the fourth terminal and the fifth terminal being configured for transmitting another pair of differential signals, the first through eighth conductive traces being respectively electrically connected to corresponding first through eighth terminals, each of the third conductive trace and the fifth conductive trace including a coupling portion, a size of the coupling portion in the transverse direction is larger than a size of the other part of the corresponding conductive trace in the transverse direction; wherein
the coupling portion of the third conductive trace and the coupling portion of the fifth conductive trace overlap in an up and down direction to increase mutual coupling;
the coupling portion of the fourth conductive trace and the coupling portion of the sixth conductive trace overlap in the up and down direction to increase mutual coupling;
the circuit board includes a plurality of layers, the coupling portion of the third conductive trace and the coupling portion of the sixth conductive trace are located on one layer of the circuit board, and the coupling portion of the fourth conductive trace and the coupling portion of the fifth conductive trace are located in another layer;
the coupling portion of the third conductive trace and the coupling portion of the fifth conductive trace are close to each other in the transverse direction, the coupling portion of the fourth conductive trace and the coupling portion of the sixth conductive trace are close to each other in the transverse direction; and one of the coupling portion of the third conductive trace and the coupling portion of the fifth conductive trace is a solid structure, and the other includes a hollow portion, one of the coupling portion of the fourth conductive trace and the coupling portion of the sixth conductive trace is a solid structure, and the other includes a hollow portion.

4. The electrical connector as claimed in claim 3, wherein the coupling portion of the third conductive trace is a solid structure, the coupling portion of the fifth conductive trace includes a hollow portion, the coupling portion of the sixth conductive trace is a solid structure, and the coupling portion of the fourth conductive trace includes a hollow portion.

5. The electrical connector as claimed in claim 4, wherein each of the coupling portion of the fourth conductive trace and the coupling portion of the fifth conductive trace includes a front solid portion, a rear solid portion, and a hollow portion connecting the front solid portion and the rear solid portion and spaced apart in the transverse direction, and the hollow portion of the fourth conductive trace and the hollow portion of the fifth conductive trace are offset away from each other in the transverse direction.

\* \* \* \* \*